US006870239B1

United States Patent
Clark

(10) Patent No.: US 6,870,239 B1
(45) Date of Patent: Mar. 22, 2005

(54) AVALANCHE PHOTODIODE HAVING AN EXTRINSIC ABSORPTION REGION

(75) Inventor: William Clark, Chelmsford, MA (US)

(73) Assignee: Solid State Scientific Corporation, Hollis, NH (US)

( * ) Notice: Subject to any disclaimer, the term of this patent is extended or adjusted under 35 U.S.C. 154(b) by 0 days.

(21) Appl. No.: 10/818,031

(22) Filed: Apr. 5, 2004

Related U.S. Application Data

(60) Provisional application No. 60/460,196, filed on Apr. 4, 2003.

(51) Int. Cl.$^7$ ............................................ H01L 31/107
(52) U.S. Cl. ...................................... 257/438; 257/441
(58) Field of Search ............................... 257/438, 441, 257/481

(56) References Cited

U.S. PATENT DOCUMENTS

| | | | | |
|---|---|---|---|---|
| 4,203,124 A | * | 5/1980 | Gordon et al. ............... | 257/185 |
| 4,326,211 A | * | 4/1982 | Smeets ........................ | 257/438 |
| 4,366,377 A | * | 12/1982 | Notthoff et al. ............. | 257/446 |
| 4,442,444 A | * | 4/1984 | Osaka ......................... | 257/186 |

FOREIGN PATENT DOCUMENTS

JP          02189984 A  *  7/1990  ......... H01L/31/107

* cited by examiner

Primary Examiner—Allan R. Wilson
(74) Attorney, Agent, or Firm—Louis J. Franco

(57) ABSTRACT

An avalanche photodiode comprises, in various implementations, a p-doped absorption region fabricated from a first material and joined along a hetero-junction with one side of an intrinsic charge-carrier multiplication region fabricated from a second material. Situated on an opposite side of the multiplication region is an n-doped diode cathode. Under reverse bias, the p-doped and n-doped regions assume, respectively, a negative charge and a positive charge and an electric field is present in the multiplication region. The first and second materials are selected to one of (i) minimize and (ii) render non-existent any conduction-band-dependent potential barrier opposing the diffusion of electrons from the absorption region into the multiplication region. Additionally, in various implementations, the first and second materials are furthermore selected to one of (i) minimize and (ii) render non-existent any valence-band-dependent potential barrier opposing the movement of holes from the multiplication region into the absorption region. The thickness of the absorption region in alternative implementations is indicated by the diffusion-length characteristics of the first material.

11 Claims, 7 Drawing Sheets

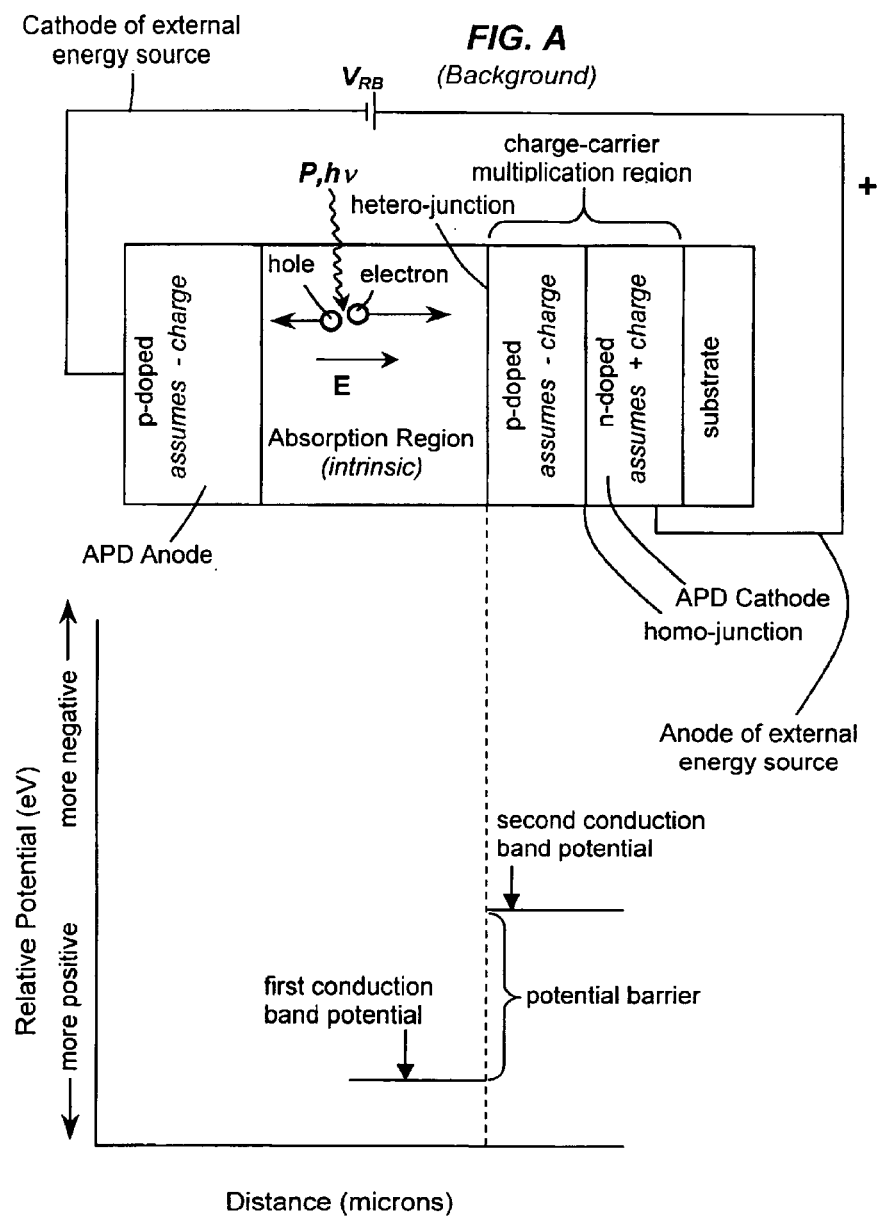
FIG. A (Background)

FIG. 1A
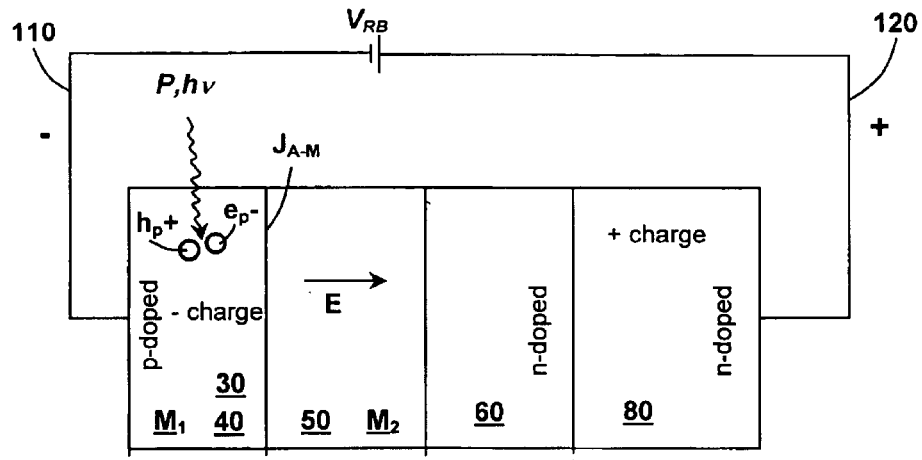
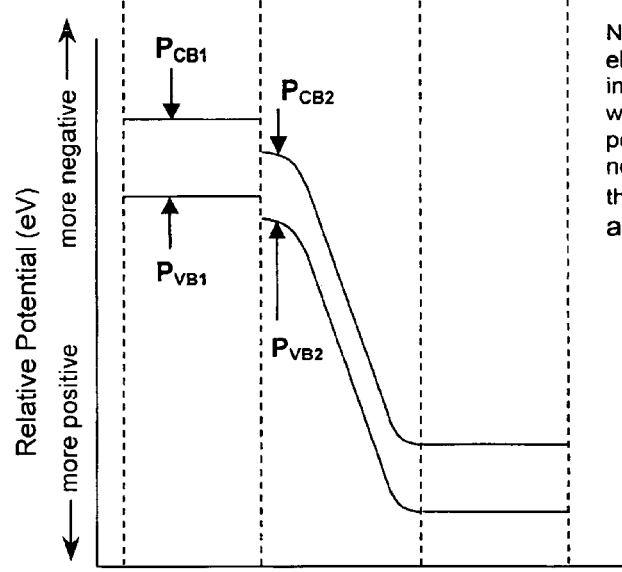
Note: Relative to an electron, potential increases with negativity whereas, relative to a hole, potential decreases with negativity. Accordingly, in this diagram $P_{CB1} > P_{CB2}$ and $P_{VB1} < P_{VB2}$
FIG. 1B

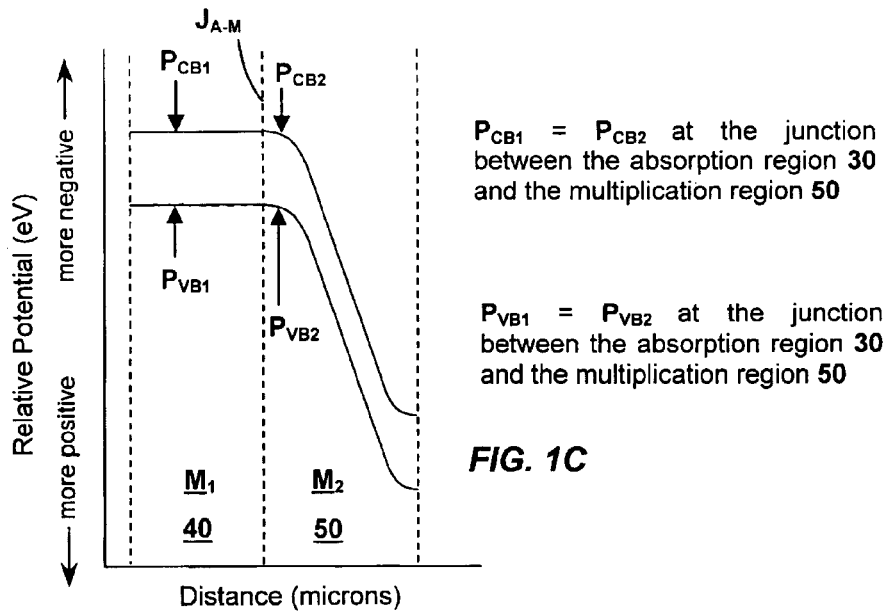

$P_{CB1} = P_{CB2}$ at the junction between the absorption region 30 and the multiplication region 50

$P_{VB1} = P_{VB2}$ at the junction between the absorption region 30 and the multiplication region 50

FIG. 1C

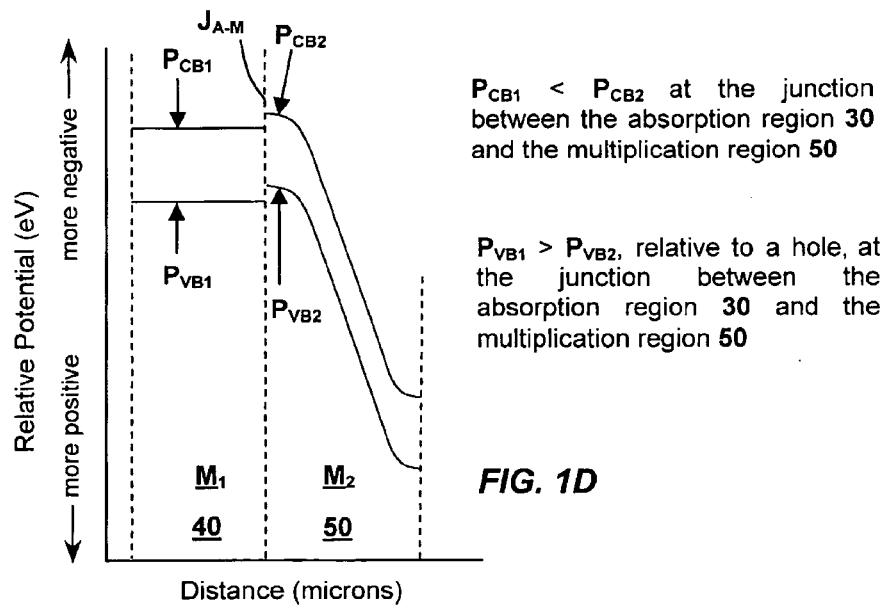

$P_{CB1} < P_{CB2}$ at the junction between the absorption region 30 and the multiplication region 50

$P_{VB1} > P_{VB2}$, relative to a hole, at the junction between the absorption region 30 and the multiplication region 50

FIG. 1D

○--➤ = $e_p^-$ moving about the absorber 30 through diffusion

◌ = $e_p^-$ after "falling down" to the valence band and recombining with a hole $h_p^+$ within the absorber 30

○➤ = electron $e_p^-$ that has diffused over the junction into the multiplication region 50 and that is being accelerated by electric field E Primary electron $e_p^-$ generating, through impact ionization in the charge-carrier multiplication region 50, a secondary charge-carrier pair comprising a secondary electron $e_s^-$ and a secondary hole $h_s^+$

FIG. 4A
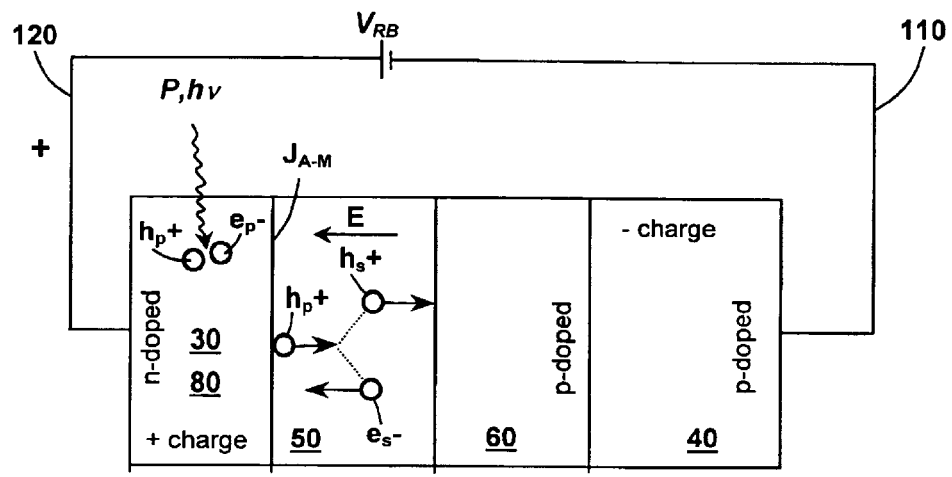
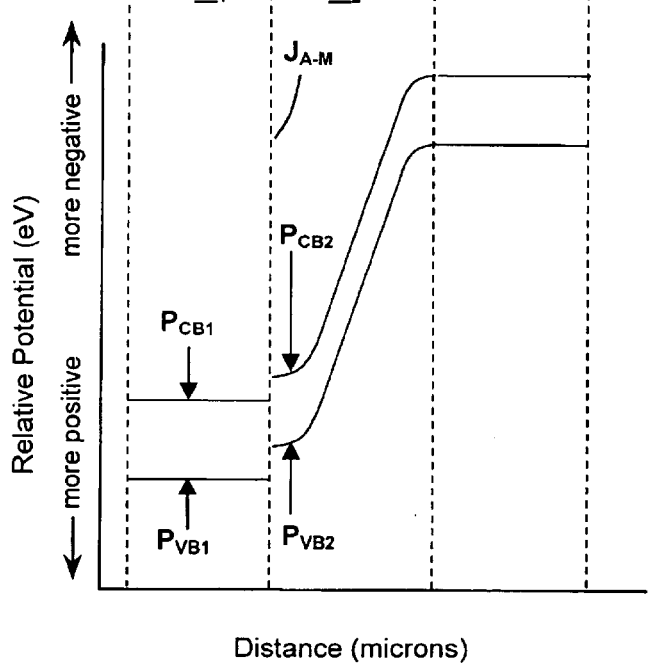
FIG. 4B

AVALANCHE PHOTODIODE HAVING AN EXTRINSIC ABSORPTION REGION

PROVISIONAL PRIORITY CLAIM

Priority based on Provisional Application, Ser. No. 60/460,196, filed Apr. 4, 2003, and entitled "AVALANCHE PHOTODIODE WITH AN EXTRINSIC ABSORPTION LAYER" is claimed.

BACKGROUND

1. Field

Implementations of the present invention relate generally to the field of photodiodes and more particularly to an avalanche photodiode (i.e., APD) with a reduced operating voltage exhibiting high speed over a large range of current densities and, under applicable conditions, reduced after-pulsing.

2. Brief Description of an Illustrative Environment and Related Art

Avalanche photodiodes are incorporated in many high performance optical communications, imaging and sensing applications because they enable high signal to noise ratio and high-speed operation. Arrays comprising pluralities of APD elements are indicated in imaging applications. Uniformity of operating voltage among the APD elements within an APD array is an important parameter in achieving accurate imaging information and wide dynamic range. Typically, an individual InGaAs/InP APD operates at between 20 and 70 volts, with an array of such APDs exhibiting operating-voltage non-uniformities among the constituent APDs of about 3 to 7 volts. Such a large range of non-uniformity in operating voltage has heretofore been regarded as an inherent characteristic of InGaAs/InP APD arrays requiring mitigation by relatively complex bias circuitry and reducing the overall dynamic range of the imager.

In Geiger-mode applications, after-pulsing results from charge carriers (i.e., electrons and holes) being trapped and later released from hetero-junction boundaries in the APD structure. A generally undesirable phenomenon, after-pulsing yields larger false photon counts and decreases the overall photon-detection probability of the system in which the after-pulsing APD is included. After-pulsing is especially present in InGaAs-InP APDs in which charge carriers generated in the InGaAs absorber must surmount a potential barrier before being injected into the multiplication region.

Homo-junction, silicon-based APDs have been applied to imaging-sensor array and Geiger-mode applications and, although the homo-junctions alleviate the after-pulsing phenomenon associated with hetero-junctions, silicon is not well suited for optical detection of wavelengths outside the range of about 0.35 to 1.0 microns. Consequently, silicon-based APDs are not sensitive to electromagnetic wavelengths in the 1.2 to 1.7 micron range, a range that is of importance to many applications.

FIG. A is a generalized representation of the structure of a typical, extant avalanche photodiode. The architecture of the APD in FIG. A is grown upon a substrate and includes a charge-carrier multiplication region and an intrinsic optical absorption region having first and second opposite sides. The charge-carrier multiplication region includes p-doped and n-doped sub-regions adjacently bound through a homo-junction. The charge-carrier multiplication region is oriented such that the p-doped sub-region forms a hetero-junction with the first side of the intrinsic absorber and the n-doped sub-region is adjacent the substrate and constitutes the cathode of the APD. In existing APDs, the absorption region is fabricated from an intrinsic first material having a first conduction band potential and the charge-carrier multiplication region is fabricated from a second material having a second conduction band potential that is higher than the first conduction band potential. Adjacent the second side of the intrinsic absorption region is a p-doped region constituting the anode of the APD. In order to introduce a reverse bias voltage across the APD, the anode and cathode of the APD are placed in electrically conductive engagement with, respectively, the cathode and anode of an external energy source.

Under reverse bias, the p-doped regions assume a negative charge and the n-doped region assumes a positive charge. With the introduction of a photon of sufficient energy hv into the intrinsic absorption region, a charge-carrier pair including a positively-charged hole and a negatively-charged electron is generated by the movement of an electron from the valence band into the conduction band as is well known by those possessing even a rudimentary understanding of physics or chemistry. The electric field induced across the APD by the application of the reverse bias causes the hole to move toward the negatively charged p-doped APD anode. Conversely, the freed electron is accelerated toward the charge-carrier multiplication region. However, the higher conduction band potential of the second material from which the multiplication region is fabricated presents a potential barrier to approaching electrons at the homo-junction. Moreover, the negatively charged p-doped sub-region in the multiplication region presents a second obstacle. Those electrons that acquire sufficient kinetic in the absorption region to overcome both obstacles are introduced into the charge-carrier multiplication region where they are greatly accelerated by a relatively high-magnitude localized electric field attributable to the juxtaposed p-doped and n-doped sub-regions. Each electron of a selected plurality of the electrons entering the multiplication is sufficiently accelerated to collide with and "knock out" still additional electrons from the crystalline lattice of the multiplication region (i.e., to undergo impact ionization). A secondary electron freed by impact ionization may itself undergo impact ionization but, on average, at least contributes to the overall current.

Depending on devise parameters as well as the magnitude of the reverse bias voltage $V_{RB}$, a portion of the "primary" electrons freed by photon absorption in the absorption region will lack sufficient energy to overcome the obstacles presented by the mismatched conduction band potentials of the first and second materials and the negatively charged p-doped sub-region of the multiplication region. Over time, these less energetic electrons accumulate near the hetero-junction and eventually themselves contribute yet an additional obstacle to the movement of primary electrons into the multiplication region by increasing the magnitude of the negative charge confronting an approaching primary electron. Accordingly, the applied reverse bias has to be substantial enough to ensure that primary electrons overcome the potential barrier at the hetero-junction. Moreover, conventional hetero-junction APDs suffer from low speed and after-pulsing due to the charge-carrier "pile-up" at the energy barriers of the hetero-junctions.

Accordingly, a need exists for an avalanche photodiode that operates at relatively low voltages and that exhibits minimal after-pulsing and very high speed over a broad range of current densities.

SUMMARY

In various implementations, an avalanche photodiode includes an absorption region having first and second opposed sides between which photon energy is absorbed in the generation of primary electron-hole pairs each of which primary electron-hole pairs comprises a primary electron and a primary hole. The absorption region is fabricated from a p-doped first material constituting a diode anode adapted for reverse-bias, electrically conductive engagement with the positive-charge-attracting cathode of an external energy source. The first material from which the absorption region is fabricated furthermore has a first conduction band potential and a first valence band potential.

A charge-carrier multiplication region is joined through a junction to the absorption region and is fabricated from a second material having a second conduction band potential and a second valence band potential. The second material is adapted to facilitate the generation, through impact ionization, of secondary electron-hole pairs, each of which secondary electron-hole pairs includes a secondary electron and a secondary hole. The introduction of primary electrons from the absorption region into the multiplication region for impact ionization is preferred over the introduction of primary holes from the absorption region into the multiplication region for impact ionization.

An n-doped diode cathode adapted for reverse-bias, electrically conductive engagement with the negative-charge-attracting anode of the external energy source is situated with respect to the multiplication region such that, when the avalanche photodiode is reverse biased, the p-doped absorption region assumes a negative charge, the n-doped diode cathode assumes a positive charge and an electric field is present across the multiplication region between the absorption region and the diode cathode.

In two alternative versions, the introduction (or migration) of primary electrons from the absorption region into the multiplication region through thermal diffusion is facilitated by the absence of a conduction-band-dependent potential barrier. In a first such version, the first conduction band potential of the first material is, relative to an electron, equal to the second conduction band potential of the second material at the junction through which the first and second materials are joined. In a second version excluding a conduction-band-dependent potential barrier, the first conduction band potential is higher, relative to an electron, than the second conduction band potential. In a third version, the first conduction band potential is lower than the second conduction band potential such that there exists a conduction-band-dependent potential barrier opposing the movement of a primary electron from the absorption region into the multiplication region, but the relative values of the first and second conduction band potentials are selected such that the probability of migration by a primary electron from the absorption region into the multiplication region is not below a predetermined minimum primary-electron-migration probability. The primary-electron-migration probability is, in various implementations, a temperature dependent quantity reflective of, for example, the percentage of primary electrons to which sufficient thermal energy has been imparted to overcome the conduction-band-dependent potential barrier.

In a typical embodiment, the multiplication region is an intrinsic crystalline material. Persons of ordinary skill in the art understand the term "intrinsic" to include "unintentionally doped." That is, because it is extremely difficult to obtain completely "pure" crystal outside of regions that are intentionally doped, practitioners of the relevant art understand that, in various applications, "intrinsic" implies "as un-doped as practicable" under the design and fabrication circumstances. Accordingly, the term "intrinsic" as used throughout the specification and claims should not be construed so narrowly as to be limited to the nearly unattainable condition of pure, totally un-doped crystal and, in any event, should be construed at least broadly enough to include "unintentionally doped." Moreover, although practitioners of the relevant arts refer to "junctions" between two regions and/or materials as if there existed a sharp, clearly defined boundary between two crystalline regions or layers, it is understood that "junctions" are typically more like "transitions" over which, for example, the dopants, and other characteristics, of one region phase out over a distance before eventually becoming virtually non-existent in the adjacent region. Accordingly, for purposes of the present specification and the appended claims, terms such as "at the junction" and "through the junction" are understood to include "over," "through" and "across" a "transition" or "interface," for example, between adjacent crystalline regions. In some variations, the movement into the absorption region of secondary holes generated through impact ionization in the multiplication region is facilitated by the absence of a valence-band-dependent potential barrier between the multiplication and absorption regions. In one such variation, the first valence band potential is, relative to a hole, equal to the second valence band potential at the junction through which a secondary hole passes in moving from the multiplication region to the absorption region.

In a second variation, the first valence band potential is lower than the second valence band potential. In a version in which the first valence band potential is higher than the second valence band potential such that there exists a valence-band-dependent potential barrier opposing the movement of a secondary hole from the multiplication region into the absorption region, the relative values of the first and second valence band potentials are selected such that the probability of migration by a secondary hole from the multiplication region into the absorption region is not below a predetermined minimum secondary-hole-migration probability. The secondary-hole-migration probability is dependent on such factors as the magnitude of the differential between the first and second valence band potentials and the magnitude of the electric field present in the multiplication region.

Although each of various combinations of first and second crystalline materials will provide an operative conduction band offset and/or an operative valence band offset, particularly advantageous results are realized from implementations in which the absorption region is fabricated from GaAsSb and the multiplication region is fabricated from InAlGaAs. In another alternative version, the multiplication region is InGaAsP. However, in embodiments in which impact ionization by electrons is preferred over impact ionization by holes, InAlGaAs is typically preferable to InGaAsP as the second material from which the multiplication region is fabricated because-electrons impact ionize at a greater rate than holes in InAlGaAs. That is, the electron to hole impact ionization rate ratio is closer to unity in InGaAsP than it is in InAlGaAs. A higher rate of impact ionization by non-preferred (i.e., "holes" in this case) is undesirable because it increases the multiplication noise. In still a third alternative embodiment, the second material is InP. However, the hole to electron impact ionization rate ratio of InP is actually greater than 1, thereby yielding even more noise than InGaAsP.

In various alternative implementations, the introduction of primary holes from the absorption region into the multiplication region for impact ionization is preferred over the introduction of primary electrons from the absorption region into the multiplication region for impact ionization. In one illustrative embodiment, an absorption region is fabricated from an n-doped first material constituting a diode cathode adapted for reverse-bias, electrically conductive engagement with the negative-charge-attracting anode of an external energy source. The first material from which the absorption region is fabricated furthermore has a first conduction band potential and a first valence band potential.

A charge-carrier multiplication region is joined through a junction to the absorption region and is fabricated from a second material having a second conduction band potential and a second valence band potential. The second material is adapted to facilitate the generation, through impact ionization, of secondary electron-hole pairs, each of which secondary electron-hole pairs includes a secondary electron and a secondary hole.

A p-doped diode anode adapted for reverse-bias, electrically conductive engagement with the positive-charge-attracting cathode of the external energy source is situated with respect to the multiplication region such that, when the avalanche photodiode is reverse biased, the n-doped absorption region assumes a positive charge, the p-doped diode anode assumes a negative charge and an electric field is present across the multiplication region between the absorption region and the diode anode.

In two alternative versions, the introduction (or migration) of primary holes from the absorption region into the multiplication through thermal diffusion is facilitated by the absence of a valence-band-dependent potential barrier. In a first such version, the first valence band potential of the first material is, relative to hole, equal to the second valence band potential of the second material at the junction through which the first and second materials are joined. In a second version excluding a valence-band-dependent potential barrier, the first valence band potential is higher, relative to a hole, than the second valence band potential. In a third version, the first valence band potential is lower than the second valence band potential such that there exists a valence-band-dependent potential barrier opposing the movement of a primary hole from the absorption region into the multiplication region, but the relative values of the first and second valence band potentials are selected such that the probability of migration by a primary hole from the absorption region into the multiplication region is not below a predetermined minimum primary-hole-migration probability. As with the primary-electron-migration probability, the primary-hole-migration probability is, in various implementations, a temperature dependent quantity reflective of, for example, the percentage of primary holes to which sufficient thermal energy has been imparted to overcome the valence-band-dependent potential barrier.

In some variations, the movement into the absorption region of secondary electrons generated through impact ionization in the multiplication region is facilitated by the absence of a conduction-band-dependent potential barrier between the multiplication and absorption regions. In one such variation, the first conduction band potential is equal to the second conduction band potential at the junction through which a secondary electron must pass in moving from the multiplication region to the absorption region. In a second variation, the first conduction band potential is lower than the second conduction band potential such that secondary electrons undergo a potential drop in migrating from the to the absorption region. In a version in which the first conduction band potential is higher than the second conduction band potential such that there exists a conduction-band-dependent potential barrier opposing the movement of a secondary electron from the multiplication region into the absorption region, the relative values of the first and second conduction band potentials are selected such that the probability of migration by a secondary electron from the multiplication region into the absorption region is not below a predetermined minimum secondary-electron-migration probability. The secondary-electron-migration probability is dependent on such factors as the magnitude of the differential between the first and second conduction band potentials and the magnitude of the electric field present in the multiplication region.

Whereas a previously extant avalanche photodiodes depends upon the application of a relatively substantial reverse bias voltage in order to "sweep" preferred charge carriers generated in the absorption region into the charge-carrier multiplication region for impact ionization, implementations of the present invention rely primarily upon thermal diffusion to introduce preferred charge carriers from the absorption region into the charge-carrier multiplication region and thus, substantially reduce the required magnitude of applied reverse-bias voltage. Moreover, various implementations exhibit very high operation speed over a large range of current densities because charge carriers do not encounter significant conduction-band-dependent potential barriers and valence-band-dependent potential barriers. It will be appreciated that, under certain operating conditions, the aforementioned attributes also yield substantially reduced after-pulsing relative to that typically exhibited by extant APDs under similar operating conditions.

Representative embodiments are more completely described in the following detailed description, the elucidation of which is facilitated by the schematic representations of the architectures and band-potential characteristics of illustrative embodiments contained in the accompanying drawings.

BRIEF DESCRIPTION OF THE DRAWINGS

FIG. A is a generalized representation of the structure of a typical, extant avalanche photodiode;

FIG. 1A schematically depicts various regions of an illustrative avalanche photodiode (APD) embodying aspects of the invention in which the migration of electrons from the extrinsic absorption region into the multiplication region is preferred over the migration of holes into the multiplication region;

FIG. 1B qualitatively indicates an illustrative potential profile of the APD in FIG. 1A;

FIG. 1C qualitatively indicates an illustrative alternative potential profile of an APD having the basic architecture of the illustrative APD in FIG. 1A;

FIG. 1D qualitatively indicates a third alternative potential profile of an APD having the basic architecture of the illustrative APD in FIG. 1A;

FIG. 4A schematically depicts various regions of an illustrative APD embodying aspects of the invention in which the migration of holes from the extrinsic absorption region into the multiplication region is preferred over the migration of electrons into the multiplication region;

FIG. 4B qualitatively indicates an illustrative potential profile of the APD in FIG. 4A;

DETAILED DESCRIPTION

Figure 2A:
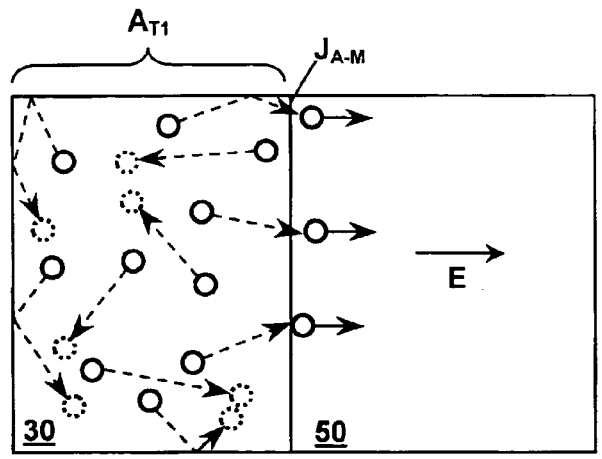
FIG. 2A is a schematic representation of charge carriers diffusing and randomly moving within an illustrative absorption region and into an adjacent multiplication region, wherein the absorption region is fabricated from a material characterized by a temperature-dependent diffusion length and has a thickness greater than the diffusion length at a predetermined temperature.

The following description of variously embodied avalanche photodiodes (APDs) having extrinsic absorption regions is illustrative in nature and is therefore not intended to limit the scope of the invention or its application of uses. The examples depicted and discussed, unless otherwise noted, are ones in which migration of electrons from the absorption region into the multiplication region for impact ionization is preferred over the migration of holes into the multiplication region for impact ionization. That is, electrons are the preferred charge carriers unless otherwise noted.

Referring to FIG. 1A, the structure of an illustrative APD 10 is schematically represented and includes an extrinsic, p-doped optical absorption region 30 that also constitutes a the anode 40 of the APD 10, a charge-carrier multiplication region 50, an n-doped depletion stop layer 60 and an n-doped cathode 80. A reverse bias voltage $V_{RB}$ is applied across the APD 10 by placing in electrically conductive engagement the p-doped anode 40 of the APD 10 with the positive-charge-attracting cathode 110 of an external energy source 100 and the n-doped cathode 80 of the APD 10 with the negative-charge-attracting anode 120 of the external energy source 100. Under-reverse bias, the p-doped APD anode 40 assumes a negative charge and the n-doped APD cathode 80 assumes a positive charge.

Referring still to FIG. 1A, with the APD 10 reversed biased, a photon P enters the optical absorption region 30. The energy hv of the incident photon P is absorbed in generating a charge carrier pair including first and second oppositely charged charge carrier types; namely, a primary electron $e_p-$ and a primary hole $h_p+$ as the primary electron $e_p-$ is elevated from the valence band to the conduction band. These charges are regarded as "primary" because they are directly generated in the absorption region 30 by the absorption of photon energy hv. In a conventional APD, an electric field across the absorption region draws primary holes toward the APD anode while primary electrons are drawn toward the multiplication region. However, in embodiments of the present invention, the absorption region 30, as previously stated, is the anode 40 of the APD 10 and, therefore, there is no electric field E across the absorption region 30. Accordingly, primary electrons $e_p-$ and holes $h_p+$ thermally diffuse and move about randomly within the absorption region 30.

Referring to FIGS. 1A and 1B, in order to facilitate the passage of primary electrons $e_p-$ from the absorption region 30 into the multiplication region 50 in the absence of an electric field, the absorption region 30 and the multiplication region 50 are fabricated from first and second materials $M_1$ and $M_2$ selected such that, at least under a predetermined reverse bias voltage $V_{RB}$, the first conduction band potential $P_{CB1}$ of the first material $M_1$ is, relative to an electron, higher than the second conduction band potential $P_{CB2}$ of the second material $M_2$. Consequently, a primary electron $e_p-$ that travels toward the junction $J_{A-M}$ between the absorption region 30 and the multiplication region 50 experiences a potential drop in crossing the junction $J_{A-M}$ (i.e., there is no potential barrier). An appropriate mechanical analogy is one in which an object falls from a ledge to a surface lower than the ledge under the force of gravity; the object, in falling, loses potential energy in favor of kinetic energy and occupies a lower potential energy state upon coming to rest on the lower surface. Conversely, in a conventional APD, an electron moves to a higher potential in moving from the absorption region to the multiplication region and it is the electric field applied across the absorption region that supplies these electrons with the energy to overcome the hurdle. With reference to the mechanical analogy, an external force is required to move the object from the lower surface up to the ledge.

In further alternative embodiments in which movement by primary electrons $e_p-$ from the first conduction band potential $P_{CB1}$ to the second conduction band potential $P_{CB2}$ is facilitated by the absence of a conduction-band-dependent potential barrier, the first and second conduction band potentials $P_{CB1}$ and $P_{CB2}$ are equal in magnitude at the junction of the absorption region 30 and the multiplication region 50. In still additional embodiments, the first conduction band potential $P_{CB1}$ is, relative to a primary electron $e_p-$, lower than the second conduction band potential $P_{CB2}$ such that there exits a conduction-band-dependent potential barrier opposing the movement of a primary electron $e_p-$ from the absorption region 30 into the multiplication region 50, but the relative values of the first and second conduction band potentials $P_{CB1}$ and $P_{CB2}$ are selected such that the probability of introduction of a primary electron $e_p-$ from the absorption region 30 into the multiplication region 50 is not below a predetermined minimum threshold probability. FIGS. 1C and 1D are graphical depictions of relative potential vs. distance for each of two illustrative implementations in which, respectively, (i) the first and second conduction band potentials $P_{CB1}$ and $P_{CB2}$ are equal at the junction $J_{A-M}$ and (ii) the first conduction band potential $P_{CB1}$ is lower than the second conduction band potential $P_{CB2}$ at the junction $J_{A-M}$.

A crystal is characterized by a temperature dependent diffusion length. As to a freed (unbound) electron in the conduction band, the diffusion length corresponds to the average distance the electron will travel within the material before recombining with a hole (i.e., becoming bound to an atom in the lattice) due to energy loss. It is known to those acquainted with the relevant arts that the diffusion length represents a statistical average and that, among plural electrons, some will travel greater distances than others before recombining (re-assuming the valence band). Various implementations of the present invention facilitate the introduction of primary electrons $e_p-$ from the absorption region 30 into the multiplication region 50 by factoring in the diffusion-length characteristics of the first material $M_1$ from which the absorption region 30 is fabricated.

Figure 2B:
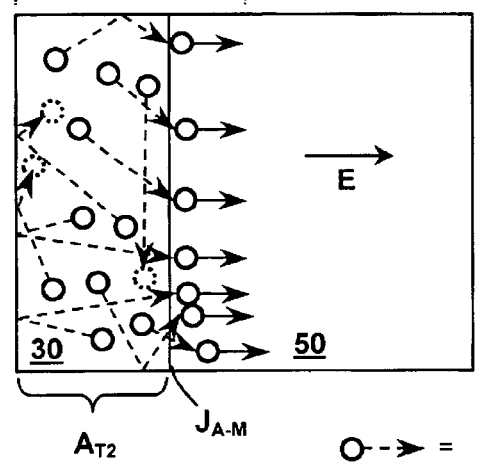
FIG. 2B is a schematic representation of charge carriers diffusing and randomly moving within an illustrative absorption region and into an adjacent multiplication region, wherein the absorption region is fabricated from the same material as the absorption region in FIG. 2A, but has a thickness less than the diffusion length at the same predetermined temperature.

More specifically, and in conjunction with FIGS. 2A and 2B, it will be appreciated that the thinner the absorption region 30 the greater the percentage of photo-generated primary electrons $e_p-$ that will encounter the junction $J_{A-M}$ between the absorption region 30 and the multiplication region 50 and "fall" into the multiplication region 50. For illustrative purposes, FIG. 2A depicts a portion an APD 10 having an absorption region 30 with a first maximum absorber thickness $A_{T1}$ that is greater than the diffusion length $L_D$ of the first material $M_1$ at a predetermined temperature $T_p$. Shown in FIG. 2B is an alternative APD 10 including an absorption region 30 fabricated from the same material $M_1$ as the absorption region in FIG. 2A, but with a second maximum absorber thickness $A_{T2}$ that is less than the diffusion length $L_D$ of the first material $M_1$ at predetermined temperature $T_p$. In each of FIGS. 2A and 2B, ten primary electrons $e_p-$ initially diffusing about the absorption region 30 are considered. In the example of FIG. 2A, seven of the ten primary electrons $e_p-$ lose energy, drop down to the valence band of the first material $M_1$ and recombine with a hole $h_p+$ within the absorption region 30 without encountering the junction $J_{A-M}$ at which the absorption region 30 and the multiplication region 50 are joined. Three of the ten primary electrons $e_p-$ encounter the junction and enter the multiplication region 50 where they are accelerated by the electric field E in a direction opposite the negatively charge, p-doped absorption region 30. Comparatively, in the example of FIG. 2B, seven of the ten primary electrons $e_p-$ have encountered the junction $J_{A-M}$ and entered the multiplication region 50 for acceleration by the electric field E while only three of the ten primary electrons $e_p-$ have recombined with holes $h_p+$ before they could encounter the junction and enter the multiplication region 50. FIGS. 2A and 2B combined qualitatively demonstrate that as the thickness of the absorption region 30 increases, the statistical probability that any particular primary electron $e_p-$ will thermally diffuse over the junction $J_{A-M}$ into the multiplication region 50 decreases. However, it will be appreciated that as the thickness of the absorption region 30 is decreased, fewer primary electrons $e_p-$ and holes $h_p+$ will be photo-generated per unit time in the absorption region 30 as a whole. Accordingly, in designing and fabricating particular embodiments within the scope of the invention, one must engage in a cost-benefit analysis that may include such factors as the diffusion length $L_D$ of the material from which the absorption region 30 is to be fabricated, the likely and predominant thermal and illumination characteristics of the environment in which the APD 10 is to operate and the desired probability of electron diffusion into the multiplication region 50.

Figure 3:
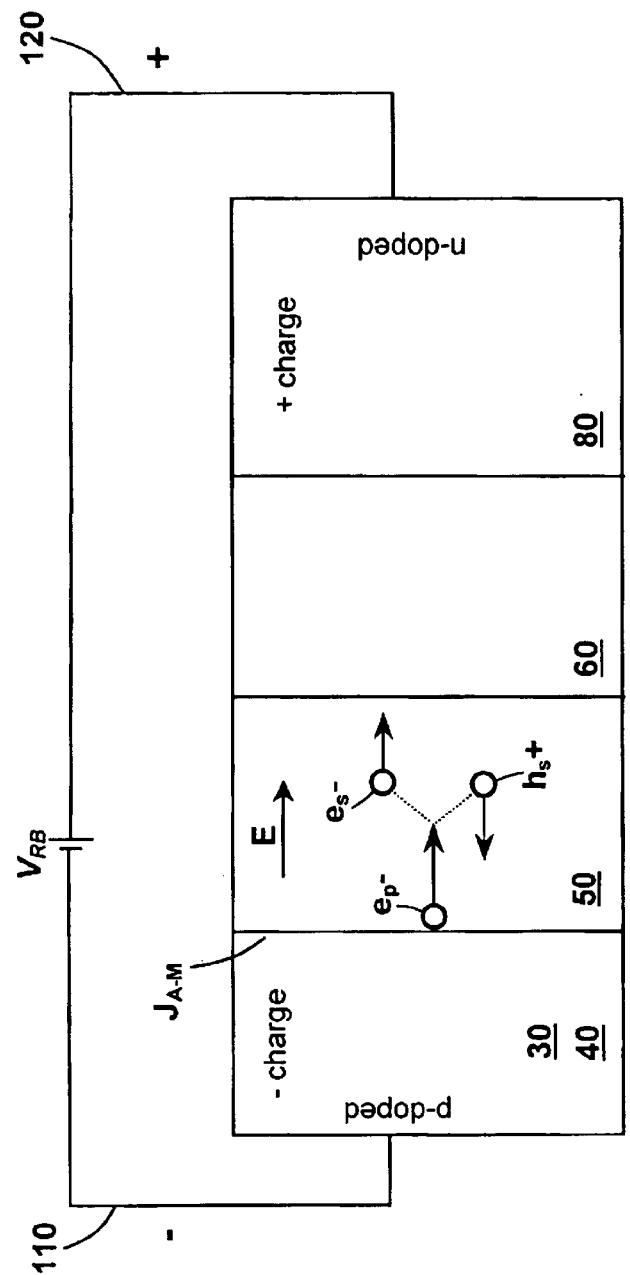
FIG. 3 schematically depicts impact ionization, within the multiplication region of an illustrative APD, by a primary electron and the acceleration directions, in the presence of an electric field, of the primary electron and the secondary charge carriers that the primary electron has generated.

As illustrated in FIG. 3, a primary electron $e_p-$ entering the multiplication region 50 is accelerated away from the absorption region 30 and toward the positively-charged n-doped diode cathode 80 in the presence of the electric field E extending through the multiplication region 50. Each such primary electron $e_p-$ has a predetermined statistical probability of dissipating energy through impact ionization and, thereby, generating additional pairs of first and second oppositely-charged charge carriers at a predetermined statistical rate. For purposes of differentiation from primary charge carriers generated in the absorption region 30 through photon-energy absorption, the first and second oppositely-charged charge carriers generated through impact ionization are referred to as secondary electrons $e_s-$ and secondary holes $h_s+$. In the presence of the electric field E created by the applied reverse bias voltage $V_{RB}$, the secondary hole $h_p+$ is drawn toward the p-doped, negatively-charged APD anode 40, while the secondary electron $e_s-$ and the primary electron $e_p-$ that generated the secondary hole $h_s+$ and electron $e_s-$ are drawn toward the n-doped, positively-charged APD cathode 80 and the anode 120 of the external energy source 100. Each secondary hole $h_s+$ and secondary electron $e_s-$ itself has a predetermined statistical probability of dissipating energy through impact ionization and, thereby, generating still additional charge carrier pairs. As explained in the summary, the noise associated with impact ionization by secondary holes $h_s+$ (i.e., where holes are the non-preferred charge carriers) is minimized in various implementations by fabricating the multiplication region 50 from a second material $M_2$ having an electron to hole impact ionization rate ratio that is greater than 1.

Referring again to the "relative potential vs. distance" graph of FIG. 1B, in order to facilitate the collection of secondary holes $h_s+$ by the diode anode 40 in various embodiments, the first and second materials $M_1$ and $M_2$ from which the diode anode 40 and the multiplication region 50 are fabricated are selected such that secondary holes $h_s+$ are not required to overcome a potential barrier due to disparate valence band potentials of the first and second materials $M_1$ and $M_2$. In one set of embodiments, of which FIG. 1A represents an example, the first valence band potential $P_{VB1}$ of the first material $M_1$ is, relative to a hole, lower than the second valence band potential $P_{VB2}$ of the second material $M_2$. Although the graphical illustration of FIG. 1A may appear to the casual observer, upon initial inspection, to represent a potential barrier from the perspective of a secondary hole $h_s+$ moving toward the diode anode 40, it will be appreciated upon further consideration that, just as a primary electron $e_p-$ was analogized, in moving from the first material $M_1$ to the second material $M_2$, to an object falling from a higher to a lower surface under the force of gravity, a secondary hole $h_s+$ is analogized to an object for which a buoyant force exceeds that of gravity (e.g., a helium-filled balloon). For such an object, potential drops with increased altitude and, therefore, it is the tendency of such an object to float upward if permitted to do so. Contemplation in view of the preceding analogy facilitates an appreciation as to why, in moving from the second valence band potential $P_{VB2}$ to the first valence band potential $P_{VB1}$ in FIG. 1A, a secondary hole $h_s+$ actually experiences a potential drop. It will also be appreciated that, due to accepted convention in physics and electrical engineering, potentials are most commonly considered from the perspective of negatively charged electrons. Accordingly, although it is otherwise natural to think in terms of a higher potential as being more positive, especially because potential is so frequently spoken of in "absolute" terms, it is actually more negative (relative to an electron). Thus, with reference to FIG. 1A, in moving from the first conduction band potential $P_{CB1}$ to the second conduction band potential $P_{CB2}$, a primary electron $e_p-$ is actually "dropping" from one potential to a less negative, lower potential. Conversely, along the same "relative potential" scale, a secondary hole $h_s+$, in moving from the second valence band potential $P_{VB2}$ to the first valence band potential $P_{VB1}$, "drops" from one potential to a more negative (lower) potential.

In a second alternative set of embodiments in which movement by secondary holes $h_s+$ from the second valence band potential $P_{VB2}$ to the first valence band potential $P_{VB1}$ is facilitated by the absence of a valence-band-dependent potential barrier, the first and second valence band potentials $P_{VB1}$ and $P_{VB2}$ are equal at the junction $J_{A-M}$ between the first and second materials $M_1$ and $M_2$, as shown in FIG. 1C.

In still another set of embodiments, as represented by FIG. 1D, the first valence band potential $P_{VB1}$ is, relative to a secondary hole $h_s+$, is higher than the second valence band potential $P_{VB2}$ such that there exits a valence-band-dependent potential barrier opposing the movement of a secondary hole $h_s+$ from the multiplication region 50 into the APD anode 40, but the relative values of the first and second valence band potentials $P_{VB1}$ and $P_{VB2}$ are selected such that the probability of introduction of a secondary hole $h_s+$ from the multiplication region 50 into the APD anode 40 is not below a predetermined minimum threshold probability (e.g., a secondary-hole-migration probability).

In various alternative implementations, the introduction of primary holes $h_s+$ from the absorption region 30 into the multiplication region 50 for impact ionization is preferred over the introduction of primary electrons $e_p-$ from the absorption region 30 into the multiplication region 50 for impact ionization. Referring to FIG. 4A, the structure of an illustrative APD 10 in which impact ionization by primary holes $h_s+$ is preferred is schematically represented and includes an extrinsic, n-doped optical absorption region 30 that also constitutes a cathode 80 of the APD 10, a charge-carrier multiplication region 50, an p-doped depletion stop layer 60 and a p-doped anode 40 situated on the opposite side of the multiplication region from the APD cathode 80. A reverse bias voltage $V_{RB}$ is applied across the APD 10 by placing in electrically conductive engagement the p-doped anode 40 of the APD 10 with the positive-charge-attracting cathode 110 of an external energy source 100 and the n-doped cathode 80 of the APD 10 with the negative-charge-attracting anode 120 of the external energy source 100. Under reverse bias, the p-doped APD anode 40 assumes a negative charge and the n-doped APD cathode 80 assumes a positive charge.

Referring to FIGS. 4A and 4B, primary electrons $e_p-$ and holes $h_p+$ are photo-generated in the absorption region 30 as a previously described. In order to facilitate the passage (i.e., by thermal diffusion) of primary holes $h_p+$ from the absorption region 30 into the multiplication region 50 in the absence of an electric field, the absorption region 30 and the multiplication region 50 are fabricated from first and second materials $M_1$ and $M_2$ selected such that, at least under a predetermined reverse bias voltage $V_{RB}$, the first valence band potential $P_{VB1}$ of the first material $M_1$ is, relative to a hole, higher than the second valence band potential $P_{VB2}$ of the second material $M_2$. Consequently, a primary hole $h_p+$ that travels toward the junction $J_{A-M}$ between the absorption region 30 and the multiplication region 50 experiences a potential drop in crossing the junction $J_{A-M}$ (i.e., there is no valence-band-dependent potential barrier).

Figure 4C:
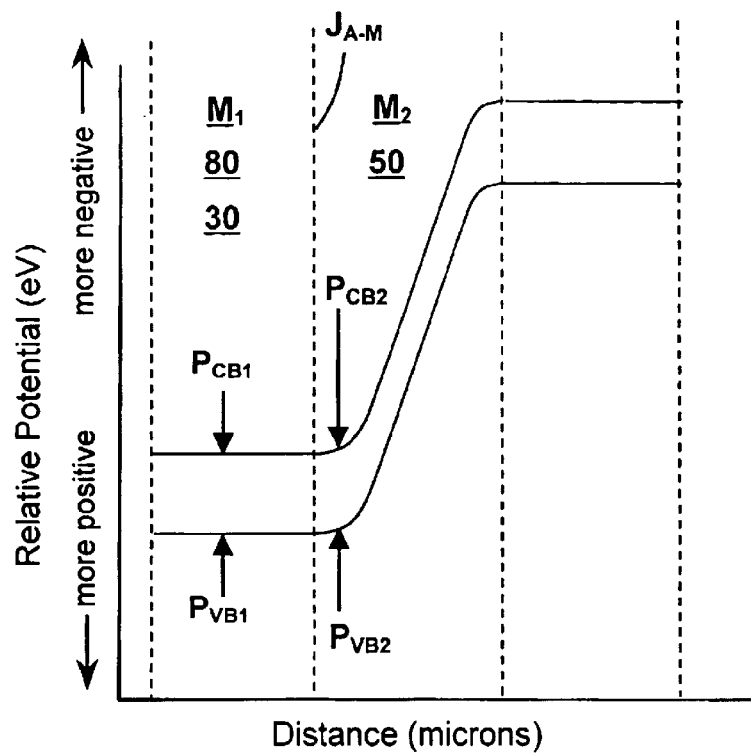
FIG. 4C qualitatively indicates an illustrative alternative potential profile of an APD having the basic architecture of the illustrative APD in FIG. 4A.
Figure 4D:
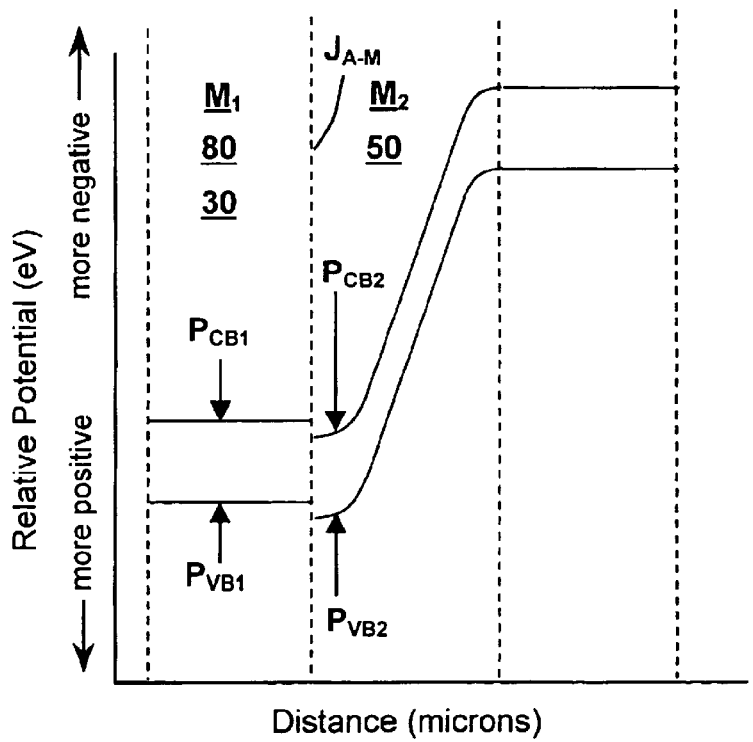
FIG. 4D qualitatively indicates a third alternative potential profile of an. APD having the basic architecture of the illustrative APD in FIG. 4A.

In further alternative embodiments in which movement by primary holes $h_p+$ from the first valence band potential $P_{VB1}$ to the second valence band potential $P_{VB2}$ is facilitated by the absence of a valence-band-dependent potential barrier, the first and second valence band potentials $P_{VB1}$ and $P_{VB2}$ are equal in magnitude at the junction $J_{AM}$ of the absorption region 30 and the multiplication region 50. In still additional embodiments, the first valence band potential $P_{VB1}$ is, relative to a primary hole $h_p+$, lower than the second valence band potential $P_{VB2}$ such that there exits a valence-band-dependant potential barrier opposing the movement of a primary hole $h_p+$ from the absorption region 30 into the multiplication region 50, but the relative values of the first and second valence band potentials $P_{VB1}$ and $P_{VB2}$ are selected such that the probability of introduction of a primary hole $h_p+$ from the absorption region 30 into the multiplication region 50 is not below a predetermined minimum primary-hole-migration probability. FIGS. 4C and 4D are graphical depictions of relative potential vs. distance for each of two illustrative implementations in which, respectively, (i) the first and second valence band potentials $P_{VB1}$ and $P_{VB2}$ are equal and (ii) the first valence band potential $P_{VB1}$ is lower than the valence band potential $P_{VB2}$.

The discussion of diffusion length characteristics and the thickness of the absorption region 30 previously presented in connection with implementations in which electrons are the preferred charge carriers applies by analogy to the diffusion of primary holes $h_p+$ into the multiplication region 50. As illustrated in FIG. 4A, a primary hole $h_p+$ entering the multiplication region 50 is accelerated away from the absorption region 30 and toward the negatively-charged p-doped diode anode 40 in the presence of the electric field E extending through the multiplication region 50. Each such primary hole $h_p+$ has a predetermined statistical probability of dissipating energy through impact ionization and, thereby, generating additional pairs of first and second oppositely charged charge carriers (i.e., secondary electrons $e_s-$ and secondary holes $h_s+$) at a predetermined statistical rate. In the presence of the electric field E created by the applied reverse bias voltage $V_{RB}$, the secondary electron $e_s-$ is drawn toward the n-doped, positively-charged APD cathode 80, while the secondary hole $h_s+$ and the primary hole $h_p+$ that generated the secondary hole $h_s+$ and electron $e_s-$ are drawn toward the p-doped, negatively-charged APD anode 40. As with implementations in which impact ionization by primary electrons $e_p-$ is preferred and facilitated, each secondary hole $h_s+$ and secondary electron $e_s-$ generated by an impact-ionizing primary hole $h_p+$ itself has a predetermined statistical probability of dissipating energy through impact ionization and, thereby, generating still additional charge carrier pairs.

Referring again to the "relative potential vs. distance" graph of FIG. 4B, in order to facilitate the collection of secondary electrons $e_s-$ by the diode cathode 80 in various embodiments, the first and second materials $M_1$ and $M_2$ from which the diode cathode 80 and the multiplication region 50 are fabricated are selected such that secondary electrons $e_s-$ are not required to overcome a potential barrier due to disparate conduction band potentials of the first and second materials $M_1$ and $M_2$. In one set of embodiments, of which FIG. 4B represents an example, the first conduction band potential $P_{CB1}$ of the first material $M_1$ is lower than the second conduction band potential $P_{CB2}$ of the second material $M_2$. Thus, a secondary electron $e_s-$, in moving from the second conduction band potential $P_{CB2}$ to the first conduction band potential $P_{CB1}$, drops to a lower potential.

In a second alternative set of embodiments in which movement by secondary electrons $e_s-$ from the second conduction band potential $P_{CB2}$ to the first conduction band potential $P_{CB1}$ is facilitated by the absence of a conduction-band-dependent potential barrier, the first and second conduction band potentials $P_{CB1}$ and $P_{CB2}$ are equal at the junction $J_{A-M}$ between the first and second materials $M_1$ and $M_2$, as shown in FIG. 4C.

In still another set of embodiments, the first conduction band potential $P_{CB1}$ is, relative to a secondary electron $e_s-$, more negative (higher) than the second conduction band potential $P_{CB2}$ such that there exits a conduction-band-dependent potential barrier opposing the movement of a secondary electron $e_s-$ from the multiplication region 50 into the APD cathode 80, but the relative values of the first and second conduction band potentials $P_{CB1}$ and $P_{CB2}$ are selected such that the probability of introduction of a secondary electron $e_s-$ from the multiplication region 50 into the APD cathode 80 is not below a predetermined secondary-electron-migration probability.

The foregoing is considered to be illustrative of the principles of the invention. Furthermore, since modifications and changes to various aspects and implementations will occur to those skilled in the art without departing from the scope and spirit of the invention, it is to be understood that the foregoing does not limit the invention as expressed in the appended claims to the exact construction, implementations and versions shown and described.

What is claimed is:

1. An avalanche photodiode having an extrinsic absorption region and comprising:

an absorption region having first and second opposed sides between which photon energy is absorbed in the generation of primary electron-hole pairs each of which primary electron-hole pairs comprises a primary electron and a primary hole, the absorption region being fabricated from a p-doped first material constituting a diode anode adapted for reverse-bias, electrically conductive engagement with the positive-charge-attracting cathode of an external energy source and having a first conduction band potential and a first valence band potential;

a charge-carrier multiplication region joined through a junction to the absorption region, the charge-carrier multiplication region being fabricated from a second material having a second conduction band potential and a second valence band potential and being adapted to facilitate the generation of secondary electron-hole pairs through impact ionization, each secondary electron-hole pair including a secondary electron and a secondary hole, wherein the introduction of primary electrons from the absorption region into the multiplication region for impact ionization is preferred over the introduction of primary holes from the absorption region into the multiplication region for impact ionization; and an n-doped diode cathode adapted for reverse-bias, electrically conductive engagement with the negative-charge-attracting anode of the external energy source and situated with respect to the multiplication region such that, when the avalanche photodiode is reverse biased, the p-doped absorption region assumes a negative charge, the n-doped diode cathode assumes a positive charge and an electric field is present across the multiplication region between the absorption region and the diode cathode, wherein, at the junction, one of (i) the first conduction band potential of the first material from which the absorption region is fabricated is, relative to an electron, one of (a) equal to and (b) higher than the second conduction band potential of the second material from which the multiplication region is fabricated such that the introduction of primary electrons from the absorption region into the multiplication through thermal diffusion is facilitated by the absence of a conduction-band-dependent potential barrier and (ii) the first conduction band potential is lower than the second conduction band potential such that there exists a conduction-band-dependent potential barrier opposing the movement of a primary electron from the absorption region into the multiplication region, but wherein the relative values of the first and second conduction band potentials are selected such that the probability of migration by a primary electron from the absorption region into the multiplication region is not below a predetermined minimum primary-electron-migration probability.

2. The avalanche photodiode of claim 1 wherein, at the junction, one of (i) the first valence band potential is, relative to a hole, one of (a) equal to and (b) lower than the second valence band potential such that the movement into the absorption region of secondary holes generated in the multiplication region is facilitated by the absence of a valence-band-dependent potential barrier and (ii) the first valence band potential is higher than the second valence band potential such that there exists a valence-band-dependent potential barrier opposing the movement of a secondary hole from the multiplication region into the absorption region, but wherein the relative values of the first and second valence band potentials are selected such that the probability of migration by a secondary hole from the multiplication region into the absorption region is not below a predetermined minimum secondary-hole-migration probability.

3. The avalanche photodiode of claim 2 wherein (i) the first material from which the absorption region is fabricated is characterized by a temperature-dependent diffusion length and (ii) the thickness of the absorption region is at least partially determined by the diffusion length characteristics of the first material in accordance with a predetermined minimum threshold probability of diffusion into the multiplication region by a primary electron.

4. The avalanche photodiode of claim 1 wherein (i) the first material from which the absorption region is fabricated is characterized by a temperature-dependent diffusion length and (ii) the thickness of the absorption region is at least partially determined by the diffusion length characteristics of the first material in accordance with a predetermined minimum threshold probability of diffusion into the multiplication region by a primary electron.

5. The avalanche photodiode of claim 4 wherein
   (i) the first material from which the absorption region is fabricated is GaAsSb, and
   (ii) the second material from which the multiplication region is fabricated includes at least one of (a) InAIGaAs (b) InGaAsP and (c) InP.

6. The avalanche photodiode of claim 1 wherein
   (iii) the first material from which the absorption region is fabricated is GaAsSb, and
   (iv) the second material from which the multiplication region is fabricated includes at least one of (a) InAIGaAs (b) InGaAsP and (c) InP.

7. The avalanche photodiode of claim 6 wherein, at the junction, one of (i) the first valence band potential is, relative to a hole, one of (a) equal to and (b) lower than the second valence band potential such that the movement into the absorption region of secondary holes generated in the multiplication is facilitated by the absence of a valence-band-dependent potential barrier and (ii) the first valence band potential is higher than the second valence band potential such that there exists a valence-band-dependent potential barrier opposing the movement of a secondary hole from the multiplication region into the absorption region, but wherein the relative values of the first and second valence band potentials are selected such that the probability of migration by a secondary hole from the multiplication region into the absorption region is not below a predetermined minimum secondary-hole-migration probability.

8. An avalanche photodiode having an extrinsic absorption region and comprising:

an absorption region having first and second opposed sides between which photon energy is absorbed in the generation of primary electron-hole, pairs each of which primary electron-hole pairs comprises a primary electron and a primary hole, the absorption region being fabricated from an n-doped first material constituting a diode cathode adapted for reverse-bias, electrically conductive engagement with the negative-charge-attracting anode of an external energy source and having a first conduction band potential and a first valence band potential;

a charge-carrier multiplication region joined through a junction to the absorption region, the charge-carrier multiplication region being fabricated from a second material having a second conduction band potential and a second valence band potential and being adapted to facilitate the generation of secondary electron-hole pairs through impact ionization, each secondary electron-hole pair including a secondary electron and a secondary hole, wherein the introduction of primary holes from the absorption region into the multiplication region for impact ionization is preferred over the introduction of primary electrons from the absorption region into the multiplication region for impact ionization; and a p-doped diode anode adapted for reverse-bias, electrically conductive engagement with the positive-charge-attracting cathode of the external energy source and situated with respect to the multiplication region such that, when the avalanche photodiode is reverse biased, the n-doped absorption region assumes a positive charge, the p-doped diode anode assumes a negative charge and an electric field is present across the multiplication region between the absorption region and the diode anode, wherein, at the junction, one of (i) the first valence band potential of the first material from which the absorption region is fabricated is, relative to a hole, one of (a) equal to and (b) higher than the second valence band potential of the second material from which the multiplication region is fabricated such that the introduction of primary holes from the absorption region into the multiplication through thermal diffusion is facilitated by the absence of a valence-band-dependent potential barrier and (ii) the first valence band potential is lower than the second valence band potential such that there exists a valence-band-dependent potential barrier opposing the movement of a primary hole from the absorption region into the multiplication region, but wherein the relative values of the first and second valence band potentials are selected such that the probability of migration by a primary hole from the absorption region into the multiplication region is not below a predetermined minimum primary-hole-migration probability.

9. The avalanche photodiode of claim 8 wherein, at the junction, one of (i) the first conduction band potential is, relative to an electron, one of (a) equal to and (b) lower than the second conduction band potential such that the movement into the absorption region of secondary electrons generated in the multiplication region is facilitated by the absence of a conduction-band-dependent potential barrier and (ii) the first conduction band potential is higher than the second conduction band potential such that there exists a conduction-band-dependent potential barrier opposing the movement of a secondary electron from the multiplication region into the absorption region, but wherein the relative values of the first and second conduction band potentials are selected such that the probability of migration by a secondary electron from the multiplication region into the absorption region is not below a predetermined minimum secondary-electron-migration probability.

10. The avalanche photodiode of claim 9 wherein (i) the first material from which the absorption region is fabricated is characterized by a temperature-dependent diffusion length and (ii) the thickness of the absorption region is at least partially determined by the diffusion length characteristics of the first material in accordance with a predetermined minimum threshold probability of diffusion into the multiplication region by a primary hole.

11. The avalanche photodiode of claim 8 wherein (i) the first material from which the absorption region is fabricated is characterized by a temperature-dependent diffusion length and (ii) the thickness of the absorption region is at least partially determined by the diffusion length characteristics of the first material in accordance with a predetermined minimum threshold probability of diffusion into the multiplication region by a primary hole.

* * * * *